US008597969B2

(12) United States Patent
Nihei et al.

(10) Patent No.: US 8,597,969 B2
(45) Date of Patent: Dec. 3, 2013

(54) MANUFACTURING METHOD FOR OPTICAL SEMICONDUCTOR DEVICE HAVING METAL BODY INCLUDING AT LEAST ONE METAL LAYER HAVING TRIPLE STRUCTURE WITH COARSE PORTION SANDWICHED BY TIGHT PORTIONS OF A SAME MATERIAL AS COARSE PORTION

(75) Inventors: Noriko Nihei, Sagamihara (JP); Shinichi Tanaka, Ashigarakami-gun (JP); Yusuke Yokobayashi, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 473 days.

(21) Appl. No.: 12/855,038

(22) Filed: Aug. 12, 2010

(65) Prior Publication Data
US 2011/0042708 A1 Feb. 24, 2011

(30) Foreign Application Priority Data
Aug. 19, 2009 (JP) ................................. 2009-190099

(51) Int. Cl.
*H01L 21/20* (2006.01)
(52) U.S. Cl.
USPC ................................ 438/46; 438/485; 257/79
(58) Field of Classification Search
USPC ............................ 257/99, 79; 438/39, 37, 485
See application file for complete search history.

(56) References Cited

U.S. PATENT DOCUMENTS

| 2005/0142677 A1* | 6/2005 | Kon et al. ........................ 438/22 |
| 2008/0290349 A1 | 11/2008 | Takahashi |
| 2009/0226606 A1* | 9/2009 | Inamura ......................... 427/131 |
| 2010/0320479 A1* | 12/2010 | Minato et al. ................... 257/88 |

FOREIGN PATENT DOCUMENTS

| JP | 06-151815 | 5/1994 |
| JP | 2004-266240 A | 9/2004 |
| JP | 2004-281863 A | 10/2004 |
| JP | 2009-004766 | 1/2009 |

OTHER PUBLICATIONS

Japanese Office Action dated Mar. 26, 2013 (and English translation thereof) in counterpart Japanese Application No. 2009-190099.

* cited by examiner

Primary Examiner — Marcos D. Pizarro
Assistant Examiner — Tifney L. Skyles
(74) Attorney, Agent, or Firm — Holtz, Holtz, Goodman & Chick, PC (57) ABSTRACT

In an optical semiconductor device including a semiconductor laminated body including at least a light emitting layer, a first metal body including at least one first metal layer formed on the semiconductor laminated body, a support substrate, a second metal body including at least one second metal layer formed on the support substrate, and at least one adhesive layer formed in a surface side of at least one of the first and second metal bodies, the semiconductor laminated body is coupled to the support substrate by applying a pressure-welding bonding process upon the adhesive layer to form a eutectic alloy layer between the first and second metal bodies. At least one of the first and second metal layers has a triple structure formed by two tight portions and a coarse portion sandwiched by the tight portions.

6 Claims, 9 Drawing Sheets

MANUFACTURING METHOD FOR OPTICAL SEMICONDUCTOR DEVICE HAVING METAL BODY INCLUDING AT LEAST ONE METAL LAYER HAVING TRIPLE STRUCTURE WITH COARSE PORTION SANDWICHED BY TIGHT PORTIONS OF A SAME MATERIAL AS COARSE PORTION

This application claims the priority benefit under 35 U.S.C. §119 to Japanese Patent Application No. JP2009-190099 filed on Aug. 19, 2009, which disclosure is hereby incorporated in its entirety by reference.

BACKGROUND

1. Field

The presently disclosed subject matter relates to an optical semiconductor device such as a light emitting diode (LED) and its manufacturing method.

2. Description of the Related Art

Generally, in a prior art method for manufacturing an optical semiconductor device, at least an n-type semiconductor layer, an active semiconductor layer and a p-type semiconductor layer are sequentially and epitaxially grown on a semiconductor growing sapphire substrate to obtain a semiconductor laminated body. Then, two or more different metal layers are sequentially deposited at a definite depositing rate on the p-type semiconductor layer to obtain a first metal laminated body. On the other hand, two or more different metal layers are sequentially deposited on a support substrate to obtain a second metal laminated body. Then, the first metal laminated body is bonded by a wafer pressure-welding bonding process to the second metal laminated body by inserting one or two adhesive layers therebetween. Finally, the growing sapphire substrate for absorbing a visible light component of light emitted from the active semiconductor layer is wholly removed by a laser lift-off process (see: JP2004-266240A and JP2004-281863A).

In the above-described prior art manufacturing method, however, when the metal layers of the first metal laminated body are sequentially deposited at a depositing rate higher than 5 Å/s, for example, in order to decrease the production time, each of the metal layers of the first metal laminated body has a low density portion or a coarse portion. As a result, the contact characteristics between the metal layers of the first metal laminated body would deteriorate, so that the metal layers would be peeled due to the difference in thermal expansion coefficient therebetween after the wafer pressure-welding bonding process.

Note that, if metals, whose differences in thermal expansion coefficient are small, are selected as the metal layers of the first metal laminated body, the peeling of the metal layers of the first metal laminated body would be avoided; however, in this case, the freedom of selection of such metals is decreased. That is, each of the metal layers of the first metal laminated body is not only intended to achieve the improvement of adhesion to the support substrate, but also, to achieve the improvement of the ohmic contact characteristic with the other layers and the contact characteristic with a reflective electrode layer, and suppress the diffusion of eutectic alloy in a eutectic alloy forming process. Therefore, since the freedom of selection of the metal layers of the first metal laminated body per se is small, this freedom of selection would be further decreased.

On the other hand, in the above-described prior art manufacturing method, when the metal layers of the first metal laminated body are sequentially deposited at a depositing rate lower than 1 Å/s, for example, each of the metal layers of the first metal laminated body has a high density portion or a tight portion. As a result, the contact characteristics between the metal layers of the first metal laminated body would be improved; however, in this case, a large residual thermal stress would be generated in each of the metal layers due to the difference in thermal expansion coefficient therebetween after the wafer pressure-welding bonding process. As a result, the first metal laminated body would be warped, so that the laser in the laser lift-off process would be not focused at the interface between the semiconductor laminated body and the growing sapphire substrate, which could not remove the growing sapphire substrate. Additionally, since the production time would be increased, the manufacturing cost would be increased.

When a first metal body including a single metal layer is provided instead of the above-mentioned first metal laminated body, similar problems would occur. In this case, if the single metal layer has a low density portion or a coarse portion, the contact characteristics between the single metal layer and its upper and lower layers would deteriorate, so that the single metal layer would be peeled due to the difference in thermal expansion coefficient therebetween after the wafer pressure-welding bonding process. On the other hand, if the single metal layer has a high density portion or a tight portion, the contact characteristics between the single metal layer and its upper and lower layers would be improved; however, a large residual stress would be generated in the single metal layer due to the difference in thermal expansion coefficient therebetween after the wafer pressure-welding bonding process. As a result, the single metal layer would be warped, so that the laser in the laser lift-off process would not be focused at the interface between the semiconductor laminated body and the growing sapphire substrate, which could not remove the growing sapphire substrate. Additionally, the manufacturing cost would be increased.

SUMMARY

The presently disclosed subject matter seeks to solve one or more of the above-described problems.

According to the presently disclosed subject matter, in an optical semiconductor device including a semiconductor laminated body including at least a light emitting layer, a first metal body including at least one first metal layer formed on the semiconductor laminated body, a support substrate, a second metal body including at least one second metal layer formed on the support substrate, and at least one adhesive layer formed in a surface side of at least one of the first and second metal bodies, the semiconductor laminated body is coupled to the support substrate by applying a pressure-welding bonding process upon the adhesive layer to form a eutectic alloy layer between the first and second metal bodies. At least one of the first and second metal layers has a triple structure formed by two tight portions and a coarse portion sandwiched by the tight portions. Thus, the contact characteristic of the triple-structured metal layer can be improved by the tight portions thereof, and a residual thermal stress occurred in the tight portions can be relaxed by the coarse portion sandwiched by the tight portions, to thereby prevent the device from being warped. Note that the production time of the device is increased by including the tight portions, however, the increase of the production time is minimized.

Also, in a method for manufacturing an optical semiconductor device, a semiconductor laminated body including at least a light emitting layer is deposited on a semiconductor growing substrate. Then, a first metal body including at least one first metal layer is formed on the semiconductor laminated body. On the other hand, a second metal body including at least one second metal layer is formed on a support substrate. Then, the semiconductor laminated body is waferbonded to the support substrate by applying a pressure-welding bonding process to at least one adhesive layer in a surface side of at least one of the first and second metal bodies to form a eutectic alloy layer between the first and second metal bodies. Finally, the semiconductor growing substrate is removed after the wafer-bonding. In this case, at least one of the first and second metal bodies is formed by forming a triple structure formed by two tight portions and a coarse portion sandwiched by the tight portions for at least one of the first and second metal layers.

BRIEF DESCRIPTION OF THE DRAWINGS

The above and other advantages and features of the presently disclosed subject matter will be more apparent from the following description of certain embodiments, taken in conjunction with the accompanying drawings, wherein.

DETAILED DESCRIPTION OF EXEMPLARY EMBODIMENTS

An embodiment of the method for manufacturing an optical semiconductor device according to the presently disclosed subject matter will now be explained with reference to FIGS. 1, 2A, 2B and 3 through 8.

Figure 1:
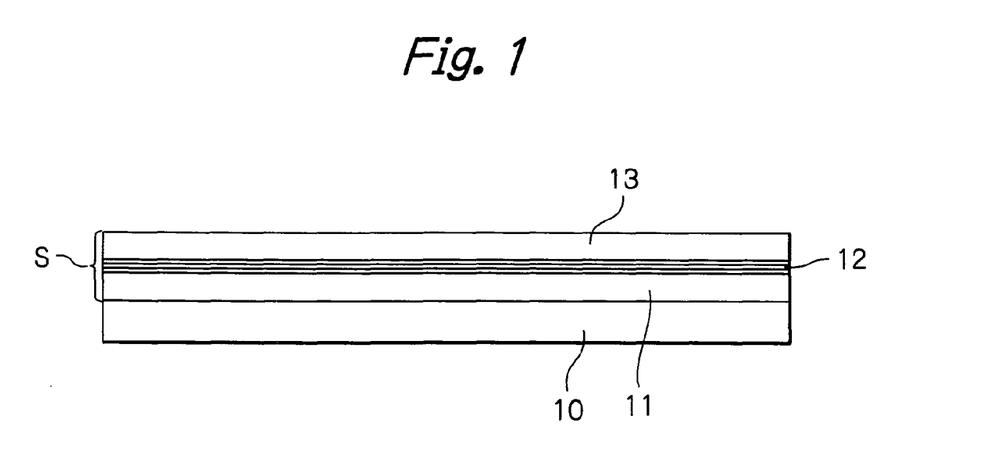
FIGS. 1, 2A, and 3 through 8 are cross-sectional views for explaining an embodiment of the method for manufacturing an optical semiconductor device according to the presently disclosed subject matter.

First, referring to FIG. 1, an n-type GaN layer 11, an active layer 12 serving as a light emitting layer and a p-type GaN layer 13 are sequentially and epitaxially grown on a semiconductor growing sapphire substrate 10 by a metal organic chemical vapor deposition (MOCVD) process. The active layer 12 can be of a multiple quantum well (MQW) structure, of a single quantum well (SQW) structure or of a single layer. In this case, the n-type GaN layer 11, the active layer 12 and the p-type GaN layer 13 constitute a semiconductor laminated body S.

Figure 2A:
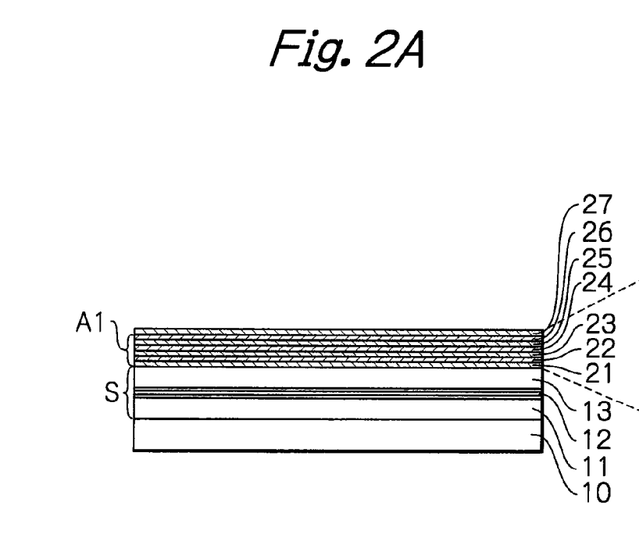

Next, referring to FIG. 2A, two or more different metal layers, i.e., an underlayer 21, a reflective electrode layer 22, a contact layer 23, barrier layers 24, 25 and 26 and an adhesive layer 27 are sequentially deposited on the p-type GaN layer 13 by a resistance heating evaporating process or an electron beam (EB) evaporating process in the same chamber. Here, the metal layers 21 to 27 constitute a metal laminated body A1.

The underlayer 21 is made of Pt which is about 5 to 30 Å thick, preferably, 10 Å thick. The underlayer 21 is in good ohmic contact with the p-type GaN layer 13, and supports the semiconductor layers 11 to 13.

The reflective electrode layer 22 is made of highly-reflective Ag which is about 500 to 5000 Å thick, preferably 3000 Å thick. Note that Al or Rh can be used instead of Ag.

The contact layer 23 is made of Ti which is about 100 to 2000 Å thick, preferably 1000 Å thick. The contact layer 23 improves the contact characteristics between the reflective electrode layer 22 and the barrier layer 24, and particularly, is in good contact with the reflective electrode layer 22. Note that Ni, W or Mo can be used instead of Ti.

The barrier layers 24, 25 and 26 suppress the outgoing diffusion of material of the reflective electrode layer 22 and the incoming diffusion of eutectic material of the adhesive layer 27 in a eutectic alloy forming process. If the barrier layers 24, 25 and 26 do not operate effectively, the electrical properties such as the increase of the forward voltage $V_f$ would deteriorate and the reflectivity of the reflective electrode layer 22 would be decreased, to thereby decrease the brightness of the device.

The barrier layer 24 is made of Pt which is about 500 to 3000 Å thick, preferably 1000 Å thick.

The barrier layer 25 is made of W which is about 1000 to 5000 Å thick, preferably 2000 Å thick. Note that Ta can be used instead of W.

The barrier layer 26 is made of Pt which is about 100 to 2000 Å thick, preferably 1000 Å thick.

The barrier layer 25 is much thicker than the barrier layers 24 and 26. Therefore, the barrier layer 25 operates to strengthen all of the barrier layers 24, 25 and 26.

The adhesive layer 27 is made of Au which is about 1000 to 5000 Å thick, preferably 2000 Å thick. The adhesive layer 27 serves as a eutectic alloy layer after the wafer pressure-welding bonding process.

Figure 2B:
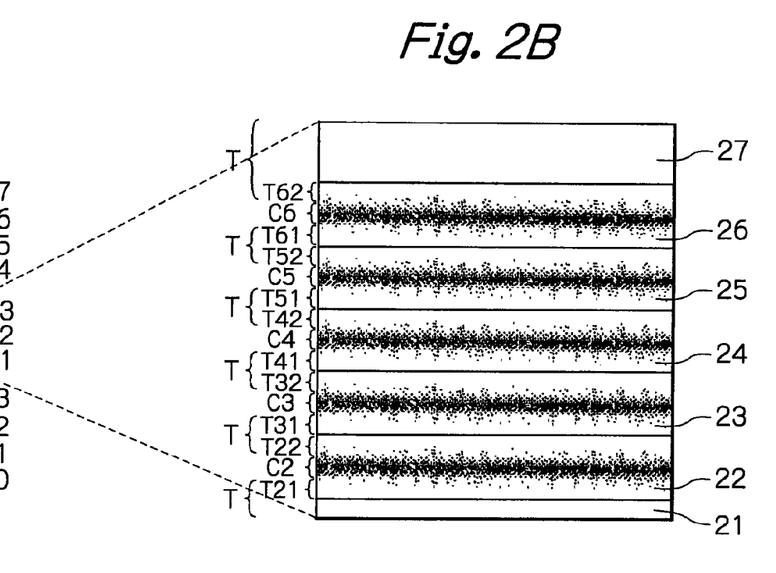
FIG. 2B is a partial enlargement of FIG. 2A.

As illustrated in FIG. 2B, which is an enlargement of the metal layers 21 to 27 of FIG. 2A, the metal layer 2$i$ (i=2, 3, . . . 6) has a triple structure formed by a coarse portion Ci sandwiched by two tight portions Ti1 and Ti2.

Each of the tight portions Ti1 and Ti2 has a high crystal grain size and is deposited at a low depositing rate such as about 0.5 to 1.0 Å/s by a resistance heating evaporating process or an EB evaporating process. On the other hand, the coarse portion Ci has a low crystal grain size and is deposited at a high depositing rate such as 5 Å/s or more by a resistance heating evaporating process or an EB evaporating process. That is, tight portions T including each interface between the metal layers 21 through 27 are formed, and coarse portions C2, C3, . . . , C6 are formed between the tight portions T, so that the tight portions T alternate with the coarse portions C2, C3, . . . , C6.

In each of the metal layers 22 to 26, the thickness ratio of the tight portion Ti1, the coarse portion Ci and the tight portion Ti2 is about 10%, about 80% and about 10%. However, in this case, if the total thickness of each of the metal layers 22 through 26 is larger than 1000 Å, the thickness of the tight portions Ti1 and Ti2 thereof is smaller than 100 Å. Therefore, since most of the metal layers 22 through 26 are occupied by the coarse portions, the production time of the metal layers 22 through 26 is not increased as compared with the case where they are completely coarse portions.

Note that, since the underlayer 21 is actually very thin, i.e., about 10 Å thick, the underlayer 21 is grown at a low depositing rate so that the underlayer 21 is substantially formed by the tight portion T. However, if the underlayer 21 is much thicker, the above-mentioned triple structure can be applied to the underlayer 21. Also, since the adhesive layer 27 is used to form a eutectic alloy, it is unnecessary to apply the above-mentioned triple structure to the adhesive layer 27. Further, since the barrier layer 25 is very thick, the peeling and warping avoiding effect by applying the triple structure thereto would be remarkably enhanced.

Figure 3:
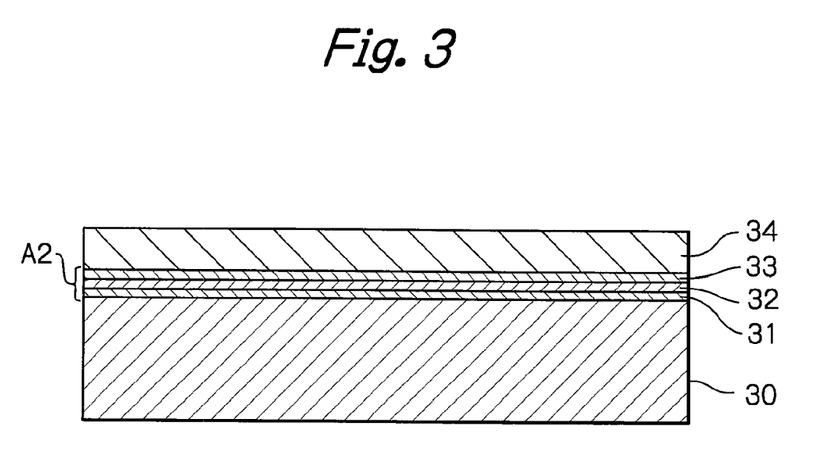

Next, referring to FIG. 3, two or more different metal layers, i.e., an intermediate electrode layer 31, a contact layer 32, a barrier layer 33 and an adhesive layer 34 are sequentially deposited on a support substrate 30 by a resistance heating evaporating process or an EB evaporating process in the same chamber. Here, the metal layers 31, 32, 33 and 34 constitute a metal laminated body A2.

The support substrate 30 is electrically conductive and is made of Si, Al or Cu having a good thermal conductivity.

The intermediate electrode layer 31 is in good ohmic contact with the support substrate 30, and is an about 1000 to 3000 Å (for example, 2000 Å) thick Pt, Au, Ni, Co or Rh layer. As occasion demands, an alloy process is carried out under nitrogen atmosphere to realize better ohmic contact characteristics with the support substrate 30.

The contact layer 32 is made of about 1000 to 3000 Å (for example, 1500 Å) thick Ti, to improve the contact characteristics between the intermediate electrode layer 31 and the barrier layer 33.

The barrier layer 33 is made of about 500 to 1500 Å (for example, 1000 Å) thick Ni, NiV or Pt, to suppress the outgoing diffusion of material of the contact layer 32 and the incoming diffusion of material of the adhesive layer 34 in a eutectic alloy forming process.

The adhesive layer 34 is made of about 3000 to 30000 Å (for example, 6000 Å) thick AuSn, Au or Sn where Au:Sn=80 wt %:20 wt % (=70 at %:30 at %) including AuSn of the adhesive layer 27 after the wafer pressure-welding bonding process. In this case, suitable additives can be added to AuSn, Au or Sn.

Figure 4:
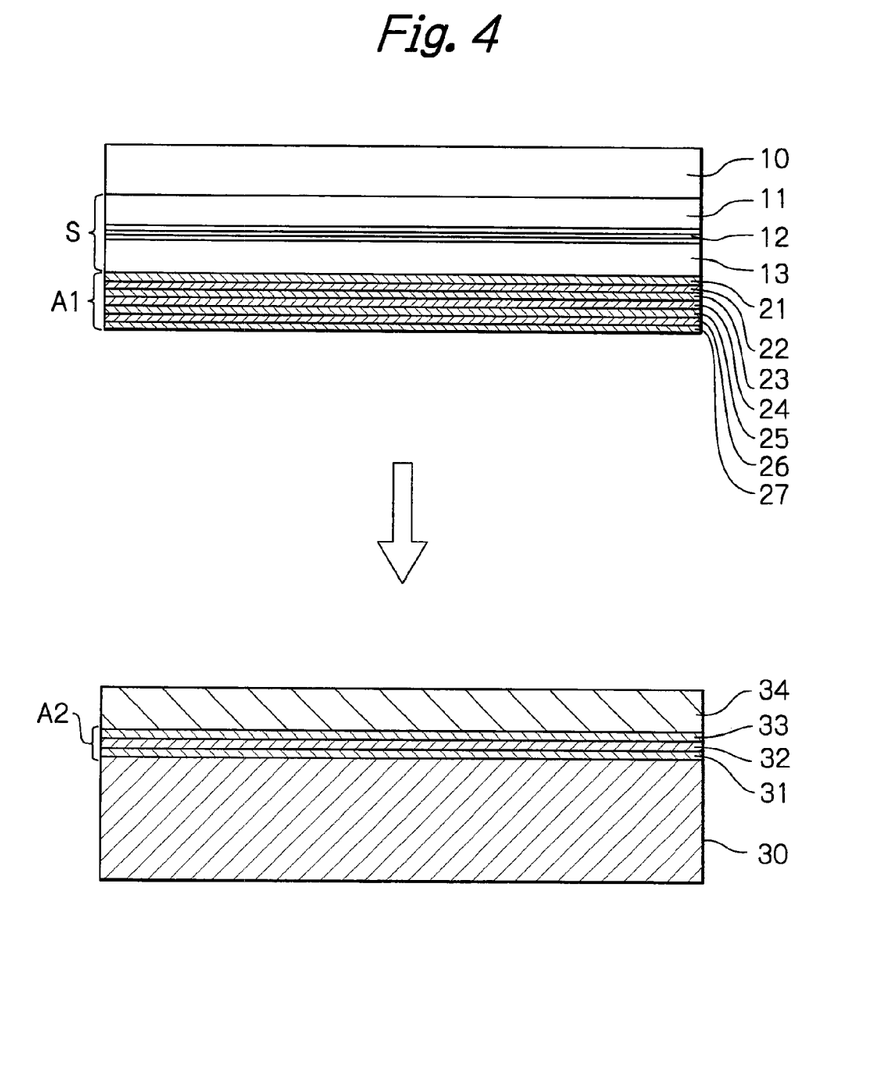
Figure 5:
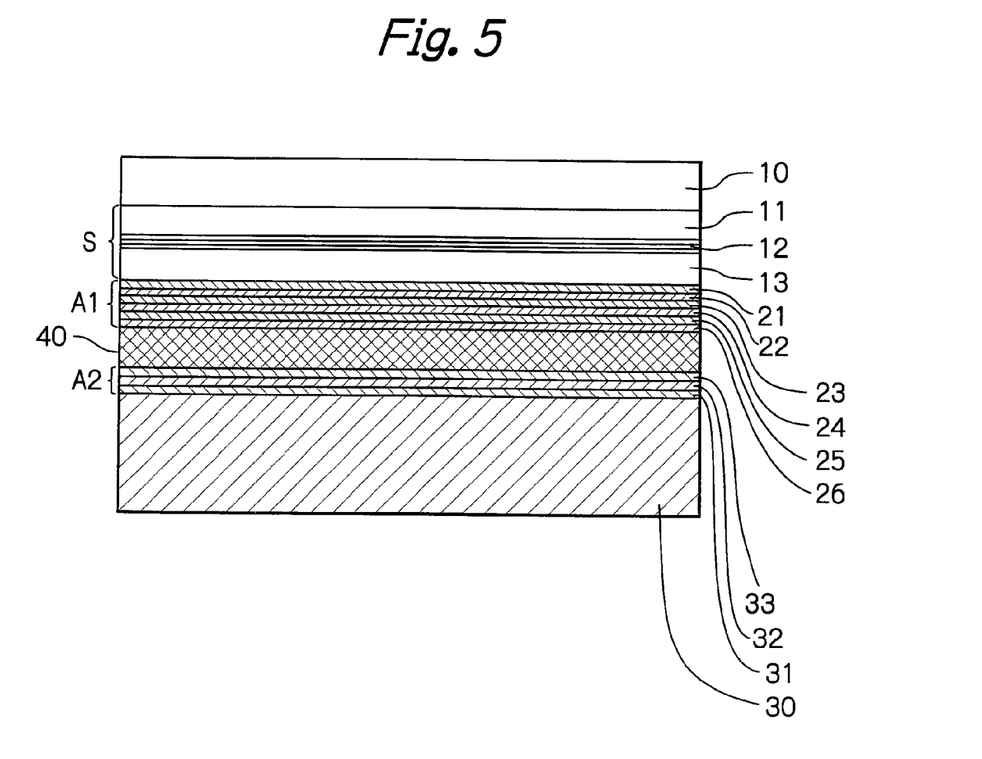

Next, referring to FIG. 4, the adhesive layer 27 on the side of the semiconductor laminated body S1 is bonded to the adhesive layer 34 on the support substrate 30 by a wafer pressure-welding bonding process. As a result, as illustrated in FIG. 5, the adhesive layers 27 and 34 are combined into an AuSn eutectic alloy layer 40. In this case, the wafer pressure-welding bonding process is carried out at a temperature of about 330° C. under a bonding pressure of about 1 MPa for about 10 minutes. In this state, residual thermal stress occurred in the metal layers 21 to 26 due to the differences in thermal expansion coefficient therebetween would be relaxed by the coarse layers thereof to prevent the bonded wafers from being warped. Note that the presently disclosed subject matter is not limited to the above-mentioned wafer pressure-welding bonding conditions such as the bonding materials, the bonding temperature, the bonding pressure and the bonding time, as long as the characteristics of the eutectic alloy layer 40 are not affected.

Figure 6:
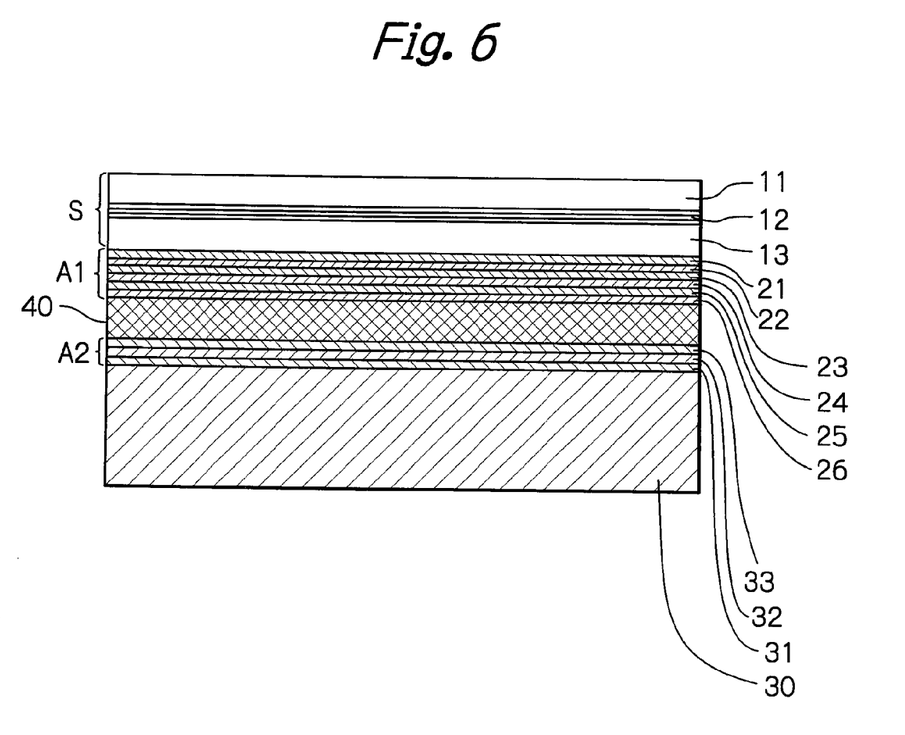

Next, referring to FIG. 6, the growing sapphire substrate 10 is removed by a laser lift-off process. In this case, the laser lift-off process is carried out by focusing a laser beam at an interface between the growing sapphire substrate 10 and the underlayer 11. Since the bonded wafers are hardly warped, this focusing of the laser beam is easy. Therefore, the growing sapphire substrate 10 is completely removed. Note that a grinding process, a mechanical polishing process, a mechanical-chemical polishing (CMP) process, a dry etching process or a wet etching process can be used instead of the laser lift-off process.

Figure 7:
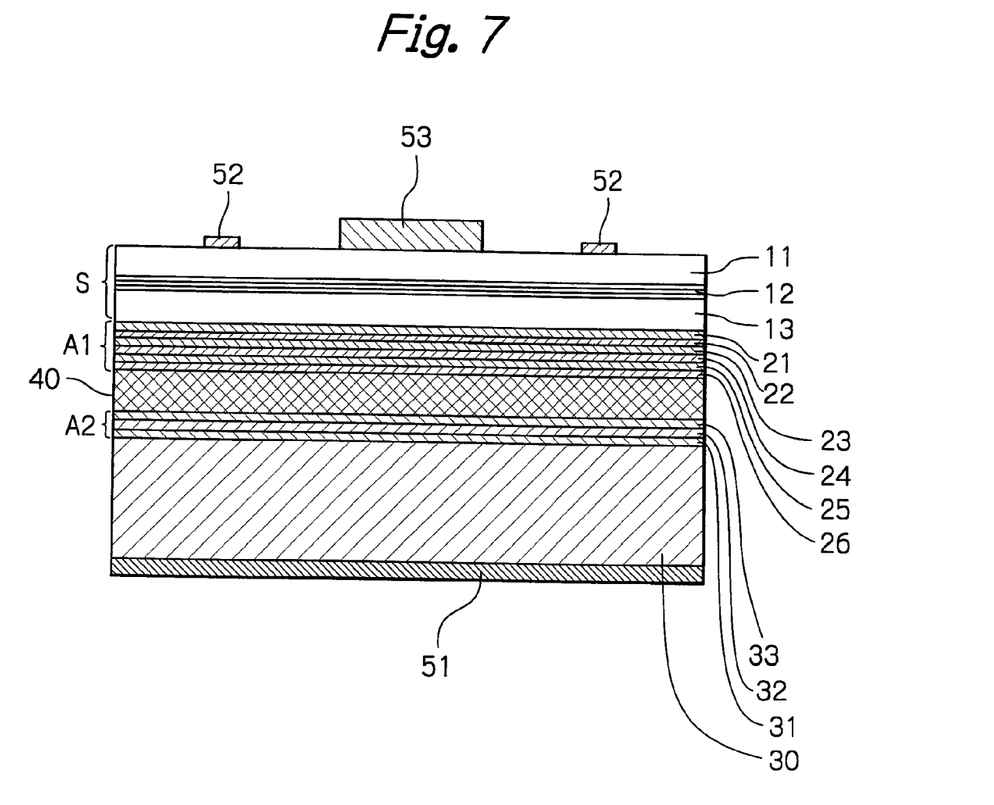

Next, referring to FIG. 7, a rear side electrode layer 51 is formed on the rear surface of the support substrate 30 by a resistance heating evaporating process or an EB evaporating process. In this case, the rear side electrode layer 51 is in ohmic contact with the support substrate 30. Then, an n-side electrode 52 is formed on the n-type GaN layer 11 by a resistance heating evaporating process or an EB evaporating process. In this case, the n-side electrode 52 is in ohmic contact with the n-type GaN layer 11. Then, an Au bonding pad 53 connected to the n-side electrode 52 is formed by a resistance heating evaporating process or an EB evaporating process. Then, an annealing process at about 400° C. under nitrogen atmosphere is performed upon the rear side electrode layer 51 and the n-side electrode 52 to alloy the ohmic contact.

Figure 8:
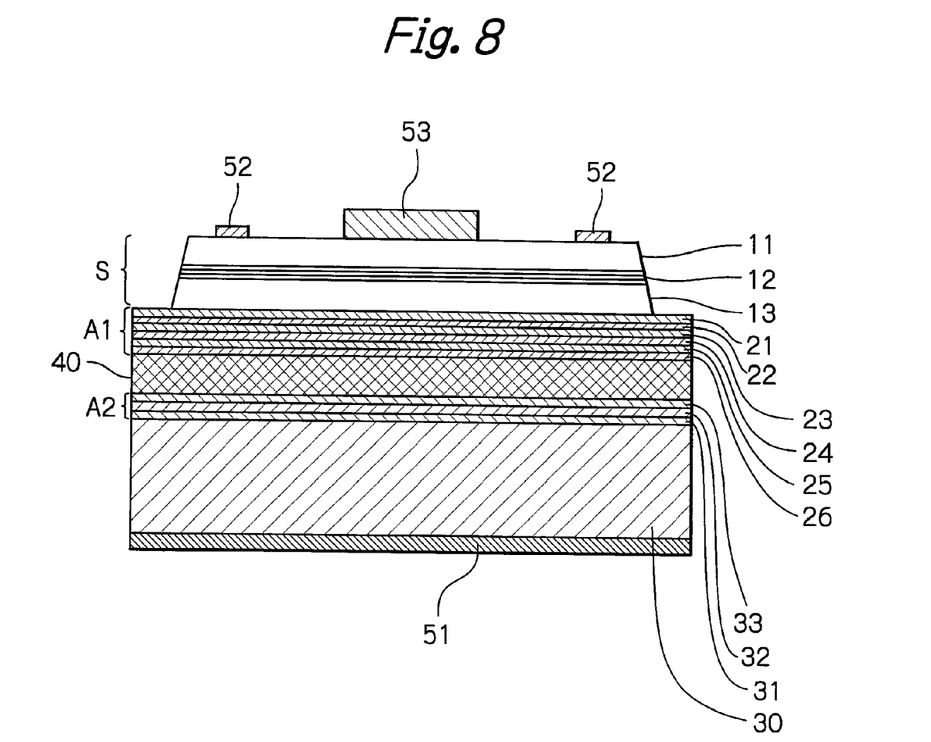

Next, referring to FIG. 8, the semiconductor layers 11 to 13 of the semiconductor laminated body S are mesa-etched by a reactive ion etching (RIE) process, so that the semiconductor laminated body S is separated on a chip basis.

Finally, the metal layer 21 to 26 of the metal laminated body A1, the AuSn eutectic alloy layer 40, the metal layers 31 to 33 of the metal laminated body A2, the support substrate 30 and the rear side electrode layer 51 are diced so that the device is separated into individual chips. As occasion demands, the entirety of the device is resin-molded (not shown).

In the above-mentioned embodiment, each of the five metal layers 22 to 26 of the metal laminated body A1 has a triple structure including a coarse portion sandwiched by two tight portions; however, at least one of the metal layers 21 to 26 can have such a triple structure. Particularly, when the barrier layer 25 is made of thick W, the above-mentioned triple structure is applied to only the barrier layer 25 in order to effectively relax the residual thermal stress therein, thus preventing the device from being peeled or warped.

Also, at least one of the metal layers 31 to 33 of the metal laminated body A2 can have the above-mentioned triple structure.

Further, although the adhesive layers 27 and 34 are provided on both sides of the metal laminated bodies A1 and A2, only one adhesive layer can be provided only on the side of one of the metal laminated bodies A1 and A2. In this case, this adhesive layer is made of AuSn.

Figure 9A:
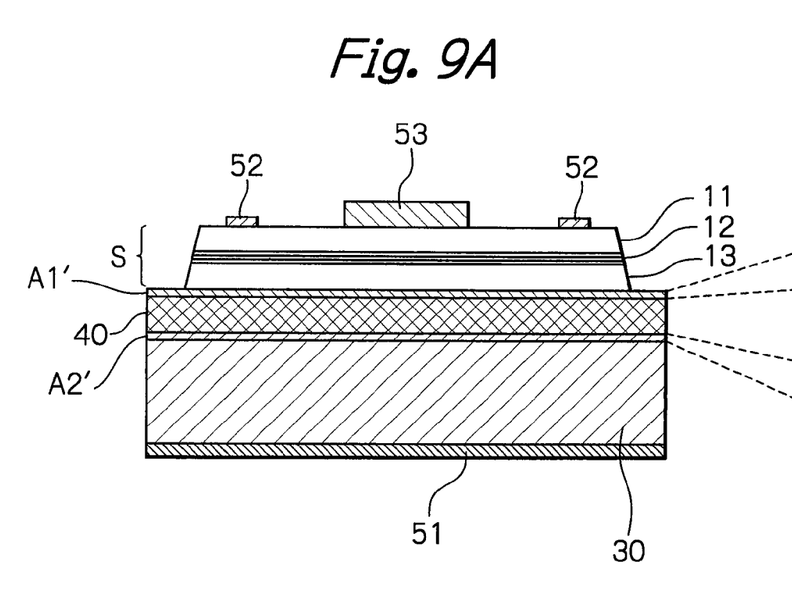
FIG. 9A is a cross-sectional view of a modification of FIG. 8.
Figure 9B:
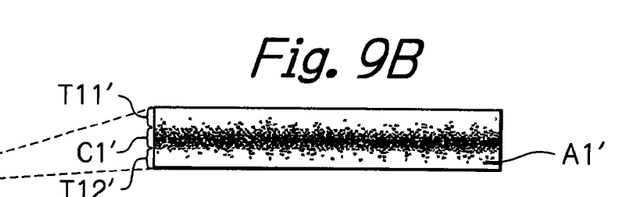
FIGS. 9B and 9C are partial enlargements of FIG. 9A.
Figure 9C:
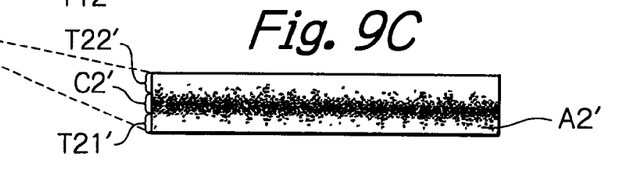

Additionally, as illustrated in FIG. 9A, and FIGS. 9B and 9C which are partial enlargements of FIG. 9A, the presently disclosed subject matter can be applied to an optical semiconductor device including a metal body A1' formed by a single metal layer which is the barrier layer 25 of FIG. 8, for example, and a metal layer A2' formed by a single metal layer A2' which is the barrier layer 33 of FIG. 8, for example. In FIGS. 9A, 9B and 9C, the metal body A1' has a tight portion T11' a coarse portion C1' and a tight portion T12' and the metal body A2' has a tight portion T21' a coarse portion C2' and a tight portion T22'.

The presently disclosed subject matter can also be applied to other semiconductor materials such as AlGaAs or AlGaInP than GaN.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

What is claimed is:

1. A method for manufacturing an optical semiconductor device comprising:
   depositing a semiconductor laminated body including at least a light emitting layer on a semiconductor growing substrate;
   forming a first metal body including at least one first metal layer on said semiconductor laminated body;
   forming a second metal body including at least one second metal layer on a support substrate;
   wafer-bonding said semiconductor laminated body to said support substrate by applying a pressure-welding bonding process to at least one adhesive layer in a surface side of at least one of said first and second metal bodies to form a eutectic alloy layer between said first and second metal bodies; and removing said semiconductor growing substrate after said wafer-bonding, wherein at least one of said forming said first metal body and said forming said second metal body comprises forming a corresponding one of said first metal layer and said second metal layer to have a triple structure formed by two tight portions and a coarse portion sandwiched by said tight portions, materials of said tight portions being the same as that of said coarse portion.

2. The method as set forth in claim 1, wherein said forming said first metal body comprises:

forming an underlayer in ohmic contact with said semiconductor laminated body; and forming a barrier layer formed by said triple structure on said underlayer.

3. The method as set forth in claim 2, wherein said at least one of said forming said first metal body and said forming said second metal body comprises:

forming said triple structure by adjusting a depositing rate of one of a resistance heating evaporating process and an electron beam evaporating process.

4. The method as set forth in claim 2, wherein said barrier layer is made of W.

5. The method as set forth in claim 1, wherein said semiconductor growing substrate comprises a sapphire substrate.

6. The method as set forth in claim 1, wherein said removing said semiconductor growing substrate comprises using a laser lift-off process.

* * * * *